(12) United States Patent
Suzuki

(10) Patent No.: US 11,621,179 B2
(45) Date of Patent: Apr. 4, 2023

(54) SUBSTRATE PROCESSING APPARATUS AND IRRADIATION POSITION ADJUSTING METHOD

(71) Applicant: Tokyo Electron Limited, Tokyo (JP)

(72) Inventor: Satoshi Suzuki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 196 days.

(21) Appl. No.: 16/874,730

(22) Filed: May 15, 2020

(65) Prior Publication Data

US 2020/0365429 A1 Nov. 19, 2020

(30) Foreign Application Priority Data

May 16, 2019 (JP) .............................. JP2019-092785

(51) Int. Cl.
| | |
|---|---|
| *H01L 21/67* | (2006.01) |
| *H01L 21/3065* | (2006.01) |
| *H01L 21/304* | (2006.01) |
| *H01L 21/677* | (2006.01) |
| *H01L 21/683* | (2006.01) |

(52) U.S. Cl.
CPC ...... *H01L 21/67115* (2013.01); *H01L 21/304* (2013.01); *H01L 21/3065* (2013.01); *H01L 21/67161* (2013.01); *H01L 21/67742* (2013.01); *H01L 21/6831* (2013.01)

(58) Field of Classification Search
None
See application file for complete search history.

(56) References Cited

U.S. PATENT DOCUMENTS

| | | | | |
|---|---|---|---|---|
| 5,372,836 | A * | 12/1994 | Imahashi | H01L 21/02675 438/30 |
| 8,486,221 | B2 * | 7/2013 | Koshimizu | H05H 1/24 156/345.37 |
| 2008/0149598 | A1 * | 6/2008 | Hayashi | H01J 37/32642 156/345.52 |
| 2010/0206482 | A1 * | 8/2010 | Matsudo | G01J 5/0003 118/712 |

(Continued)

FOREIGN PATENT DOCUMENTS

| | | | |
|---|---|---|---|
| JP | 2010-199526 A | 9/2010 | |
| WO | WO-2015081727 A1 * | 6/2015 | ............ G01J 5/0007 |

*Primary Examiner* — Sylvia MacArthur
(74) *Attorney, Agent, or Firm* — Pearne & Gordon LLP

(57) ABSTRACT

A substrate processing apparatus includes a placing table, having a first placing surface on which a substrate is placed and a rear surface opposite to the first placing surface, provided with a first window which allows the first placing surface and the rear surface to communicate with each other and which is configured to transmit light; a first adjusting device configured to hold a first light irradiation unit configured to irradiate light toward the first window and configured to adjust an irradiation position of the light on the rear surface; and a first reflection member, having retroreflection property, disposed at the rear surface of the placing table to enclose the first window, and configured to reflect a part of the light and return reflection light indicating a deviation between the irradiation position of the light and a position of the first window to the first light irradiation unit.

8 Claims, 5 Drawing Sheets

(56) References Cited

U.S. PATENT DOCUMENTS

2012/0247669 A1* 10/2012 Matsudo ........... H01L 21/67248
   118/712
2018/0315640 A1* 11/2018 Ueda ................. H01L 21/68742
2019/0237348 A1* 8/2019 Li ......................... G01J 5/0007
2020/0365429 A1* 11/2020 Suzuki .............. H01L 21/68735

* cited by examiner

SUBSTRATE PROCESSING APPARATUS AND IRRADIATION POSITION ADJUSTING METHOD

CROSS-REFERENCE TO RELATED APPLICATION

This application claims the benefit of Japanese Patent Application No. 2019-092785 filed on May 16, 2019, the entire disclosure of which is incorporated herein by reference.

TECHNICAL FIELD

The various aspects and embodiments described herein pertain generally to a substrate processing apparatus and an irradiation position adjusting method.

BACKGROUND

Patent Document 1 proposes a technique of measuring a temperature of a substrate. In this technique, light is irradiated from a light irradiation unit toward a window which is formed at a placing table on which the substrate is placed and is capable of transmitting the light, and the temperature of the substrate is measured based on an interference state of reflection light returning to the light irradiation unit after being reflected on the substrate.

Patent Document 1: Japanese Patent Laid-open Publication No. 2010-199526

SUMMARY

In one exemplary embodiment, a substrate processing apparatus includes a placing table, having a first placing surface on which a substrate is placed and a rear surface opposite to the first placing surface, provided with a first window which allows the first placing surface and the rear surface to communicate with each other and which is configured to transmit light; a first adjusting device configured to hold a first light irradiation unit configured to irradiate light for state measurement of the substrate toward the first window and configured to adjust an irradiation position of the light irradiated from the first light irradiation unit on the rear surface of the placing table; and a first reflection member, having retroreflection property, disposed at the rear surface of the placing table to enclose the first window, and configured to reflect a part of the light irradiated from the first light irradiation unit and return reflection light indicating a deviation between the irradiation position of the light and a position of the first window to the first light irradiation unit.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
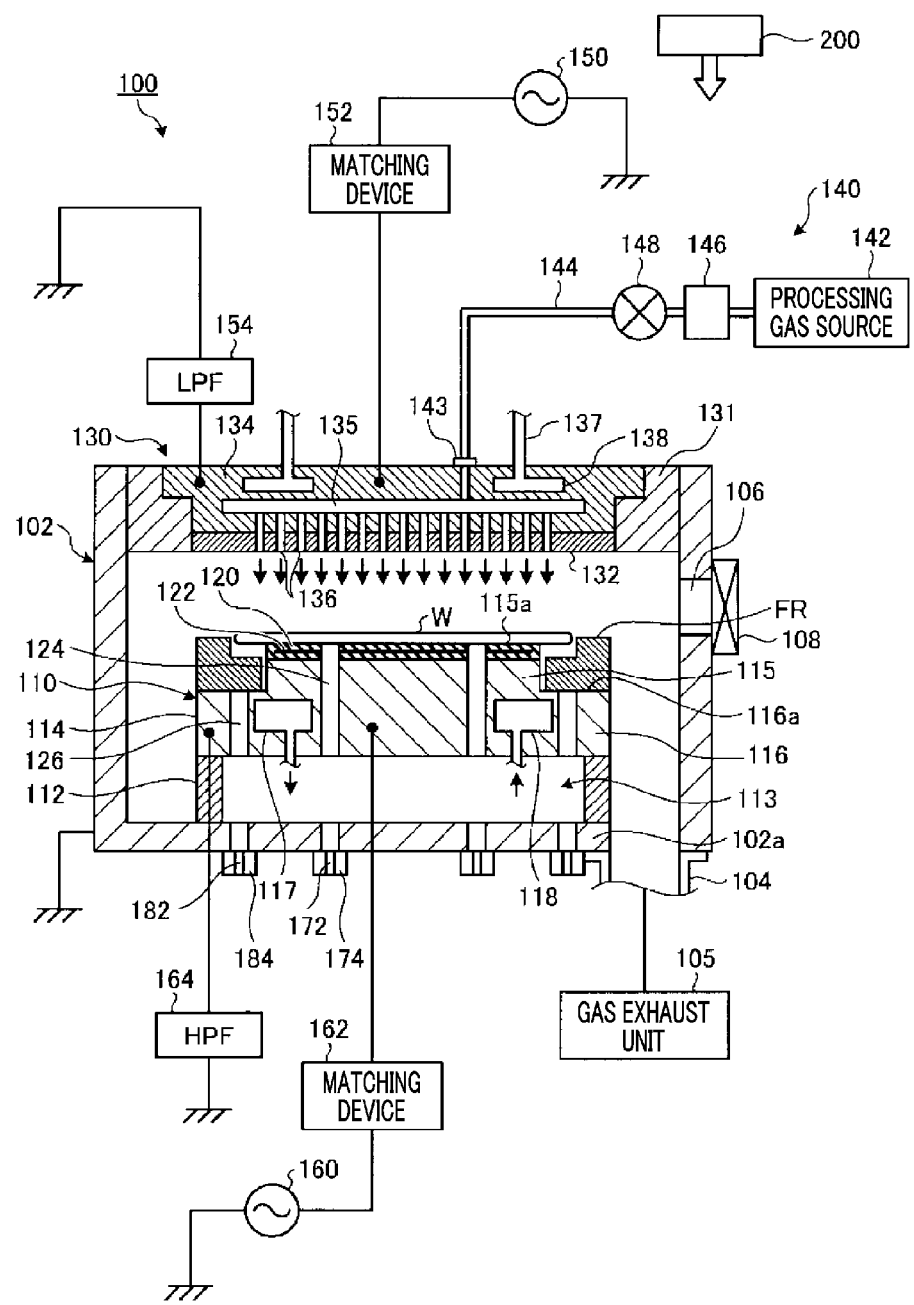
FIG. 1 is a diagram illustrating an example configuration of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

When light for temperature measurement of a substrate is irradiated toward a window which is formed at a placing table, it is important that an irradiation position of the light coincides with a position of the window. However, the irradiation position of the light and the position of the window formed at the placing table may not necessarily be coincident. For example, if the position of the window is deviated from an initial position when maintenance of the placing table is performed, there is a likelihood that the irradiation position of the light and the position of the window may be deviated from each other. Further, when the placing table experiences thermal expansion or thermal contraction, the position of the light and the position of the window may not be coincident as the position of the window may be deviated from the initial position.

If the light for the temperature measurement of the substrate is irradiated toward the window from a light irradiation unit in the state that the irradiation position of the light and the position of the window are deviated, reflection light which returns to the light irradiation unit by being reflected on the substrate may not be obtained, so it is difficult to perform the temperature measurement of the substrate based on an interference state of the reflection light. To solve the problem, it is considered to adjust the irradiation position of the light so that the irradiation position of the light is coincident with the position of the window. By way of example, there may be considered a method of scanning the irradiation position of the light from the light irradiation unit at the entire surface of the placing table facing the light irradiation unit to thereby search for a position of the window where an intensity of the reflection light is maximized, and adjusting the irradiation position of the light toward the found position of the window.

In this adjusting method, however, since the irradiation position of the light from the light irradiation unit needs to be scanned at the entire surface of the placing table facing the light irradiation unit, it takes time to carry out the adjustment of the irradiation position of the light. Thus, there is a demand for a technique capable of shortening the time taken for the adjustment of the irradiation position of the light.

[Configuration of Plasma Processing Apparatus]

First, a substrate processing apparatus according to an exemplary embodiment will be explained. In the exemplary embodiment, a plasma processing apparatus configured to perform a plasma processing on a semiconductor substrate (hereinafter, simply referred to as "wafer") as a processing target will be described as an example of the substrate processing apparatus.

FIG. 1 is a diagram illustrating an example configuration of a plasma processing apparatus 100 according to the exemplary embodiment. The plasma processing apparatus 100 shown in FIG. 1 is configured as a parallel plate type plasma processing apparatus.

The plasma processing apparatus 100 is equipped with a processing vessel 102 having a cylindrical shape and made of, by way of non-limiting example, aluminum having an anodically oxidized (alumite-treated) surface. The processing vessel 102 is grounded. A substantially columnar placing table 110 for placing the wafer W thereon is provided at a bottom 102a of the processing vessel 102. The placing table 110 is equipped with a susceptor 114 which constitutes a lower electrode. The susceptor 114 is supported by a plate-shaped insulating member 112 made of ceramic or the like. A space 113 maintained in an atmospheric atmosphere is provided between the susceptor 114 and the bottom 102a of the processing vessel 102.

The placing table 110 is equipped with a susceptor temperature controller 117 which is capable of adjusting a temperature of the susceptor 114 to a required temperature. The susceptor temperature controller 117 is configured to circulate a temperature control medium into, for example, a temperature control medium path 118 provided within the susceptor 114.

Figure 2:
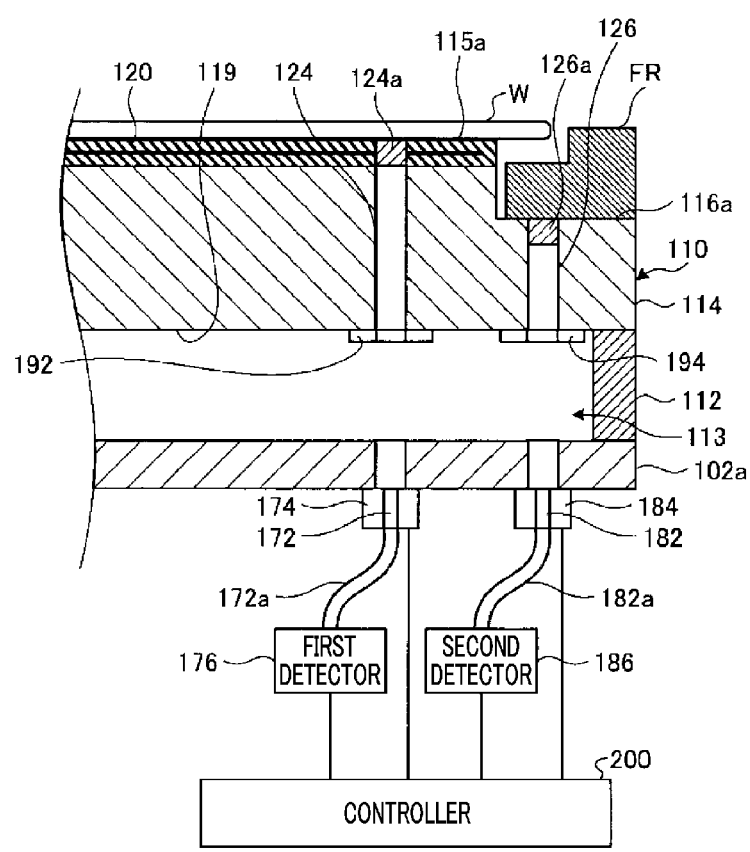
FIG. 2 is a schematic cross sectional view for describing major components of a placing table, a first light irradiation unit, a second light irradiation unit, a first adjusting device and a second adjusting device shown in FIG. 1.

The susceptor 114 has a substrate placing portion 115 of a protruding shape formed at an upper central portion thereof to place the wafer W thereon; and a peripheral portion 116 provided at a peripheral side of the substrate placing portion 115 and having a top surface lower than the substrate placing portion 115. A top surface of the substrate placing portion 115 serves as a substrate placing surface 115a on which the wafer W is placed, and the top surface of the peripheral portion 116 serves as a focus ring placing surface 116a on which a focus ring FR is placed. As illustrated in FIG. 2, if an electrostatic chuck 120 is provided at an upper portion of the substrate placing portion 115, a top surface of this electrostatic chuck 120 serves as the substrate placing surface 115a. In the following, the substrate placing portion 115 and the electrostatic chuck 120 together will be appropriately referred to as "substrate placing portion 115."

The electrostatic chuck 120 has a structure in which an electrode 122 is embedded in an insulator. A DC voltage of, e.g., 1.5 kV is applied to the electrostatic chuck 120 from a non-illustrated DC power supply which is connected to the electrode 122. As a result, the wafer W is electrostatically attracted to the electrostatic chuck 120. The substrate placing portion 115 has a diameter smaller than a diameter of the wafer W, so that a peripheral portion of the wafer W is protruded from the substrate placing portion 115 when the wafer W is placed thereon.

The focus ring FR is disposed at an upper peripheral portion of the susceptor 114 to surround the wafer W placed on the substrate placing surface 115a of the electrostatic chuck 120. The focus ring FR is placed on the focus ring placing surface 116a of the peripheral portion 116 such that an inner side surface of the focus ring FR surrounds an outer side surface of the substrate placing portion 115. The focus ring FR is an example of a ring member.

A gas passage is formed in the insulator 112, the susceptor 114 and the electrostatic chuck 120, and a heat transfer medium (for example, a backside gas such as a He gas) is supplied through this gas passage to a rear surface of the wafer W which is placed on the substrate placing surface 115a. Heat is transferred between the susceptor 114 and the wafer W through this heat transfer medium, so that the wafer W is maintained at a preset temperature.

The placing table 110 is provided with a first window 124 extending from below the substrate placing portion 115 up to the substrate placing surface 115a. The first window 124 is a transmission window configured to transmit light toward the wafer W placed on the substrate placing surface 115a. Further, a first light irradiation unit 172 configured to irradiate light for temperature measurement of the wafer W toward the first window 124 is provided at the bottom 102a of the processing vessel 102, corresponding to the position of the first window 124. The first light irradiation unit 172 is held by a first adjusting device 174 and fixed by the first adjusting device 174 to a position of a through hole formed at the bottom 102a, corresponding to the position of the first window 124. An irradiation position of the light irradiated toward the first window 124 from the first light irradiation unit 172 is adjusted by the first adjusting device 174. Details of the first light irradiation unit 172 and the first adjusting device 174 will be elaborated later.

Further, the placing table 110 is also provided with a second window 126 extending from below the peripheral portion 116 up to the focus ring placing surface 116a. The second window 126 is a transmission window configured to transmit light toward the focus ring FR placed on the focus ring placing surface 116a. Further, a second light irradiation unit 182 configured to irradiate light for temperature measurement of the focus ring FR toward the second window 126 is provided at the bottom 102a of the processing vessel 102, corresponding to the position of the second window 126. The second light irradiation unit 182 is held by a second adjusting device 184 and fixed by the second adjusting device 184 to a position of a through hole formed at the bottom 102a to correspond to the position of the second window 126. An irradiation position of the light irradiated toward the second window 126 from the second light irradiation unit 182 is adjusted by the second adjusting device 184. Details of the second light irradiating unit 182 and the second adjusting device 184 will be elaborated later.

An upper electrode 130 is disposed above the susceptor 114, facing the susceptor 114. A space formed between this upper electrode 130 and the susceptor 114 is a plasma generation space. The upper electrode 130 is supported at an upper portion of the processing vessel 102 with an insulating shield member 131 therebetween.

The upper electrode 130 mainly includes an electrode plate 132; and an electrode supporting body 134 configured to support the electrode plate 132 in a detachable manner. The electrode plate 132 is made of, by way of non-limiting example, quartz, and the electrode supporting body 134 is made of a conductive material such as, but not limited to, aluminum having an alumite-treated surface.

The electrode supporting body 134 is provided with a processing gas supply 140 configured to introduce a processing gas from a processing gas source 142 into the processing vessel 102. The processing gas source 142 is connected to a gas inlet opening 143 of the electrode supporting body 134 via a gas supply line 144.

The gas supply line 144 is provided with a mass flow controller (MFC) 146 and an opening/closing valve 148 in sequence from the upstream side, as illustrated in FIG. 1, for example. Here, a flow control system (FCS) may be provided instead of the MFC. A fluorocarbon gas ($C_xF_y$) such as, but not limited to, a $C_4F_8$ gas is supplied from the processing gas source 142 as the processing gas for etching.

The processing gas source 142 is configured to supply, for example, an etching gas for plasma etching. Further, though only one processing gas supply system including the gas supply line 144, the opening/closing valve 148, the mass flow controller 146 and the processing gas source 142 is illustrated in FIG. 1, the plasma processing apparatus 100 is actually equipped with a plurality of processing gas supply systems. For example, processing gases such as $CF_4$, $O_2$, $N_2$ and $CHF_3$ are supplied into the processing vessel 102 at independently controlled flow rates.

The electrode supporting body 134 is provided with, for example, a substantially cylindrical gas diffusion space 135 in which the processing gas introduced from the gas supply line 144 can be uniformly diffused. Further, a multiple number of gas discharge holes 136 is formed in a bottom portion of the electrode supporting body 134 and the electrode plate 132 to discharge the processing gas from the gas diffusion space 135 into the processing vessel 102. The processing gas diffused in the gas diffusion space 135 can be uniformly discharged toward the plasma generation space from the gas discharge holes 136. In this point of view, the upper electrode 130 serves as a shower head configured to supply the processing gas.

The upper electrode 130 is equipped with an electrode supporting body temperature controller 137 capable of controlling a temperature of the electrode supporting body 134 to a preset temperature. For example, the electrode supporting body temperature controller 137 is configured to circulate a temperature control medium into a temperature control medium path 138 provided within the electrode supporting body 134.

A gas exhaust line 104 is connected to a bottom portion of the processing vessel 102, and the gas exhaust line 104 is connected to a gas exhaust unit 105. The gas exhaust unit 105 includes a vacuum pump such as a turbo molecular pump and is configured to adjust the inside of the processing vessel 102 into a preset decompressed atmosphere. The processing vessel 102 is evacuated as the gas exhaust unit 105 adjusts the inside of the processing vessel 102 into the preset decompressed atmosphere. Further, a carry-in/out opening 106 for the wafer W is provided at a sidewall of the processing vessel 102, and a gate valve 108 is provided at the carry-in/out opening 106. When a carry-in/out of the wafer W is performed, the gate valve 108 is opened. The wafer W is carried in or out through the carry-in/out opening 106 by a non-illustrated transfer arm or the like.

The upper electrode 130 is connected to a first high frequency power supply 150, and a power feed line thereof is provided with a first matching device 152 inserted therein. The first high frequency power supply 150 is configured to output a high frequency power for plasma formation having a frequency ranging from 50 MHz to 150 MHz. By applying the power having such a high frequency to the upper electrode 130, high-density plasma in a desirable dissociated state can be formed within the processing vessel 102. Therefore, a plasma processing can be performed under a lower pressure condition. Desirably, a frequency of the output power of the high frequency power supply 150 may be in a range from 50 MHz to 80 MHz, and, typically, is adjusted to 60 MHz or thereabout.

The susceptor 114 configured as the lower electrode is connected to a second high frequency power supply 160, and a power feed line thereof is provided with a second matching device 162 inserted therein. The second high frequency power supply 160 is configured to output a high frequency bias power having a frequency ranging from several hundreds of kHz to several tens of MHz. A frequency of the output power of the second high frequency power supply 160 is typically adjusted to, for example, 2 MHz, 13.56 MHz, or the like.

Further, the susceptor 114 is also connected with a high pass filter (HPF) 164 configured to filter a high frequency current flowing into the susceptor 114 from the first high frequency power supply 150. The upper electrode 130 is connected to a low pass filter (LPF) 154 configured to filter a high frequency current flowing into the upper electrode 130 from the second high frequency power supply 160.

An overall operation of the plasma processing apparatus 100 having the above-described configuration is controlled by a controller 200. The controller 200 may be implemented by various kinds of integrated circuits or electronic circuits. By way of non-limiting example, ASIC (Application Specific Integrated Circuit), a CPU (Central Processing Unit), or the like may be used.

[Configurations of Placing Table, First Light Irradiation Unit, Second Light Irradiation Unit, First Adjusting Device and Second Adjusting Device]

Now, referring to FIG. 2, configurations of major components of the placing table 110, the first light irradiation unit 172, the second light irradiation unit 182, the first adjusting device 174 and the second adjusting device 184 will be explained. FIG. 2 is a schematic cross sectional view for describing the configurations of the major components of the placing table 110, the first light irradiation unit 172, the second light irradiation unit 182, the first adjusting device 174 and the second adjusting device 184 shown in FIG. 1.

The placing table 110 includes the substrate placing surface 115*a* for placing the wafer W thereon, the focus ring placing surface 116*a* for placing the focus ring FR thereon, and a rear surface 119 opposite to the substrate placing surface 115*a* and the focus ring placing surface 116*a*. The rear surface 119 faces the bottom 102*a* of the processing vessel 102 with the space 113 therebetween. The substrate placing surface 115*a* is an example of a first placing surface, and the focus ring placing surface 116*a* is an example of a second placing surface.

The placing table 110 is provided with the first window 124 which allows the substrate placing surface 115*a* and the rear surface 119 to communicate with each other and is capable of transmitting the light. The first window 124 is provided with a sealing member 124*a* made of a material capable of transmitting the light. Further, the first light irradiation unit 172 configured to irradiate the light for the temperature measurement of the wafer W toward the first window 124 is provided at the bottom 102a of the processing vessel 102, corresponding to the position of the first window 124. The first light irradiation unit 172 is held by the first adjusting device 174 and fixed by the first adjusting device 174 at the position of the through hole formed at the bottom 102a to correspond to the position of the first window 124.

The first adjusting device 174 is configured to hold the first light irradiation unit 172 and be capable of adjusting an irradiation position of the light reaching the rear surface 119 of the placing table 110 after being irradiated from the first light irradiation unit 172.

A first reflection member 192 is disposed at the rear surface 119 of the placing table 110 to enclose the first window 124. The first reflection member 192 has retroreflection property. The first reflection member 192 reflects a part of the light irradiated from the first light irradiation unit 172 and return the reflection light to the first light irradiation unit 172. This reflection light indicates a deviation between the irradiation position of the corresponding light and the position of the first window 124. That is, when maintenance of the placing table 110 is performed, for example, the first window 124 may be deviated from an initial position, and, as a result, the light irradiated toward the first window 124 from the first light irradiation unit 172 may be deviated to the vicinity of the first window 124 and irradiated to the rear surface 119 of the placing table 110. In such a case, the first reflection member 192 returns the reflection light, which indicates the deviation between the irradiation position of the light at the rear surface 119 of the placing table 110 and the position of the first window 124, to the first light irradiation unit 172.

Figure 3:
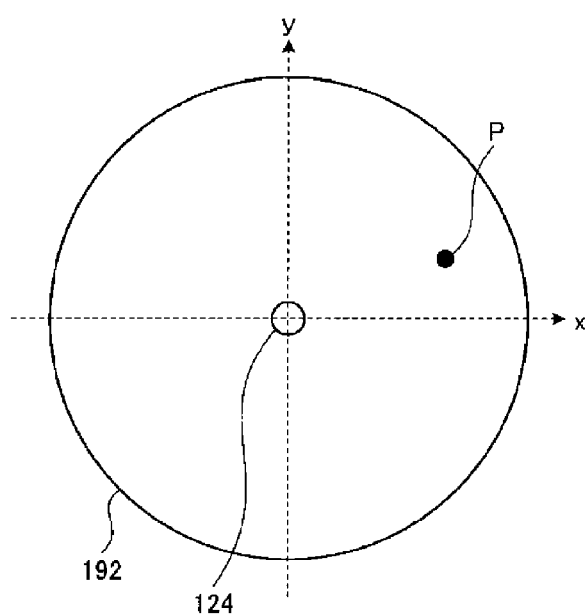
FIG. 3 is a plan view of a first reflection member seen from a rear surface side of the placing table.

FIG. 3 is a plan view of the first reflection member 192 seen from the rear surface 119 side of the placing table 110. As depicted in FIG. 3, the first reflection member 192 has a cylindrical shape an edge of which lies on a concentric circle centered around the position of the first window 124. A through hole through which the first window 124 is exposed is formed at a central portion of the first reflection member 192. If the light irradiated from the first light irradiation unit 172 toward the first window 124 is deviated to the vicinity of the first window 124 and is thus irradiated to the rear surface 119 of the placing table 110, there is generated a deviation between the irradiation position of the light at the rear surface 119 of the placing table 110 and the position of the first window 124. FIG. 3 illustrates an irradiation position P of the light reaching the rear surface 119 of the placing table 110 after being irradiated from the first light irradiation unit 172. The irradiation position P of the light is deviated from the position of the first window 124. The first reflection member 192 reflects, at the irradiation position P, a part of the light irradiated from the first light irradiation unit 172 and returns the reflection light indicating the deviation between the irradiation position P and the position of the first window 124 to the first light irradiation unit 172. The first adjusting device 174 adjusts the irradiation position P by moving the first light irradiation unit 172 along an x-axis and a y-axis which intersect with each other at the position of the first window 124 on the rear surface 119 of the placing table 110 as an origin [(x, y)=(0, 0)]. By way of example, the first adjusting device 174 adjusts the irradiation position P by moving the first light irradiation unit 172 along the x-axis and the y-axis in parallel with the rear surface 119 of the placing table 110. Further, the first adjusting device 174 may be configured to adjust the irradiation position P by inclining the first light irradiation unit 172 along each of the x-axis and the y-axis.

Reference is made back to FIG. 2. The first light irradiation unit 172 is connected to a first detector 176 by an optical fiber 172a. The first detector 176 incorporates a light source and generates the light for the temperature measurement of the wafer W. The light generated by the first detector 176 is sent to the first light irradiation unit 172 via the optical fiber 172a and irradiated toward the first window 124 from the first light irradiation unit 172. If the light irradiated toward the first window 124 from the first light irradiation unit 172 is deviated to the vicinity of the first window 124 and irradiated to the rear surface 119 of the placing table 110, the reflection light indicating the deviation between the irradiation position of the light and the position of the first window 124 is returned to the first light irradiation unit 172 from the first reflection member 192. The reflection light returned to the first light irradiation unit 172 from the first reflection member 192 is guided to the first detector 176 via the optical fiber 172a. The first detector 176 detects an intensity of the reflection light returned to the first light irradiation unit 172 from the first reflection member 192, and outputs a detection result to the controller 200. The controller 200 controls the first adjusting device 174 based on the detection result of the first detector 176 so that the irradiation position of the light at the rear surface 119 of the placing table 110 coincides with the position of the first window 124.

Furthermore, the first light irradiation unit 172 is connected to a temperature measurer (not shown) by a spectrograph which is provided at a portion of the optical fiber 172a. The temperature measurer irradiates the light for the temperature measurement of the wafer W toward the first window 124 from the first light irradiation unit 172, and measures a temperature of the wafer W based on an interference state of the light reflected on the wafer W after being transmitted through the first window 124. Since details of the method of measuring the temperature of the wafer W is described in, for example, Patent Document 1, explanation thereof will be omitted here.

Further, the placing table 110 is provided with the second window 126 which allows the focus ring placing surface 116a and the rear surface 119 to communicate with each other and is capable of transmitting the light. The second window 126 is provided with a sealing member 126a made of a material capable of transmitting the light. Further, the second light irradiation unit 182 configured to irradiate the light for the temperature measurement of the focus ring FR toward the second window 126 is provided at the bottom 102a of the processing vessel 102, corresponding to the position of the second window 126. The second light irradiation unit 182 is held by the second adjusting device 184 and fixed by the second adjusting device 184 to the position of the through hole formed at the bottom 102a to correspond to the position of the second window 126.

The second adjusting device 184 is configured to hold the second light irradiation unit 182 and be capable of adjusting an irradiation position of the light reaching the rear surface 119 of the placing table 110 after being irradiated from the second light irradiation unit 182.

A second reflection member 194 is disposed at the rear surface 119 of the placing table 110 to enclose the second window 126. The second reflection member 194 has retroreflection property. The second reflection member 194 reflects a part of the light irradiated from the second light irradiation unit 182 and return the reflection light to the second light irradiation unit 182. This reflection light indicates a deviation between an irradiation position of the corresponding light and the position of the second window 126. That is, when maintenance of the placing table 110 is performed, for example, the second window 126 may be deviated from an initial position, and, as a result, the light irradiated toward the second window 126 from the second light irradiation unit 182 may be deviated to the vicinity of the second window 126 and irradiated to the rear surface 119 of the placing table 110. In such a case, the second reflection member 194 returns the reflection light, which indicates the deviation between the irradiation position of the light at the rear surface 119 of the placing table 110 and the position of the second window 126, to the second light irradiation unit 182. The second reflection member 194 has a cylindrical shape an edge of which lies on a concentric circle centered around the position of the second window 126. A through hole through which the second window 126 is exposed is formed at a central portion of the second reflection member 194. The second adjusting device 184 adjusts the irradiation position of the light at the rear surface 119 of the placing table 110 by moving the second light irradiation unit 182 along an x-axis and a y-axis which intersect with each other at the position of the second window 126 on the rear surface 119 of the placing table 110 as an origin [(x, y)=(0, 0)].

The second light irradiation unit 182 is connected to a second detector 186 by an optical fiber 182a. The second detector 186 incorporates a light source and generates the light for the temperature measurement of the focus ring FR. The light generated by the second detector 186 is sent to the second light irradiation unit 182 via the optical fiber 182a and irradiated toward the second window 126 from the second light irradiation unit 182. If the light irradiated toward the second window 126 from the second light irradiation unit 182 is deviated to the vicinity of the second window 126 and irradiated to the rear surface 119 of the placing table 110, the reflection light indicating the deviation between the irradiation position of the light and the position of the second window 126 is returned to the second light irradiation unit 182 from the second reflection member 194. The reflection light returned to the second light irradiation unit 182 from the second reflection member 194 is guided to the second detector 186 via the optical fiber 182a. The second detector 186 detects an intensity of the reflection light returned to the second light irradiation unit 182 from the second reflection member 194, and outputs a detection result to the controller 200. The controller 200 controls the second adjusting device 184 based on the detection result of the second detector 186 so that the irradiation position of the light at the rear surface 119 of the placing table 110 coincides with the position of the second window 126.

Furthermore, the second light irradiation unit 182 is connected to a temperature measurer (not shown) by a spectrograph which is provided at a portion of the optical fiber 182a. The temperature measurer irradiates the light for the temperature measurement of the focus ring FR toward the second window 126 from the second light irradiation unit 182, and measures a temperature of the focus ring FR based on an interference state of the light reflected on the focus ring FR after being transmitted through the second window 126. Since details of the method of measuring the temperature of the focus ring FR is described in, for example, Patent Document 1, explanation thereof will be omitted here.

[Example of Adjusting Method by Controller]

Figure 4:
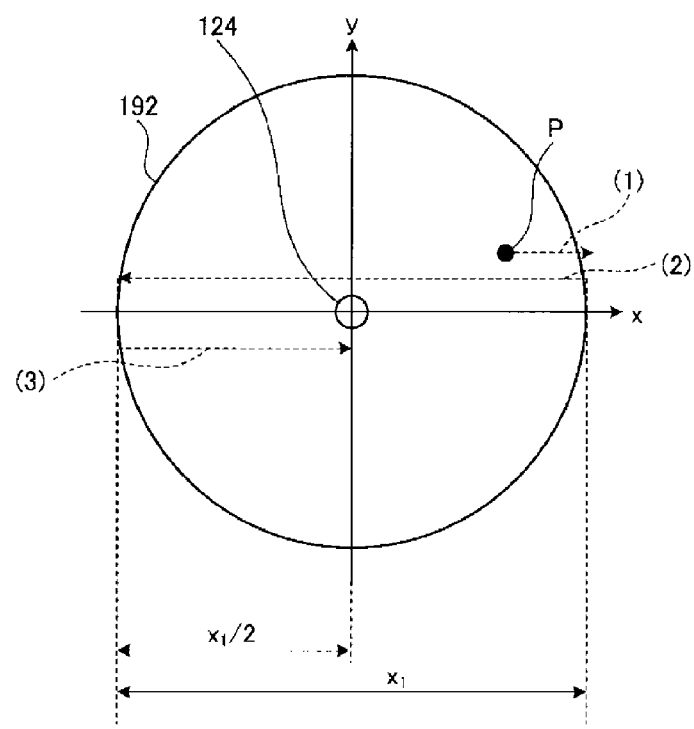
FIG. 4 is a diagram for describing an example processing for adjusting an irradiation position of light at a rear surface of the placing table toward a position of a first window.
Figure 5:
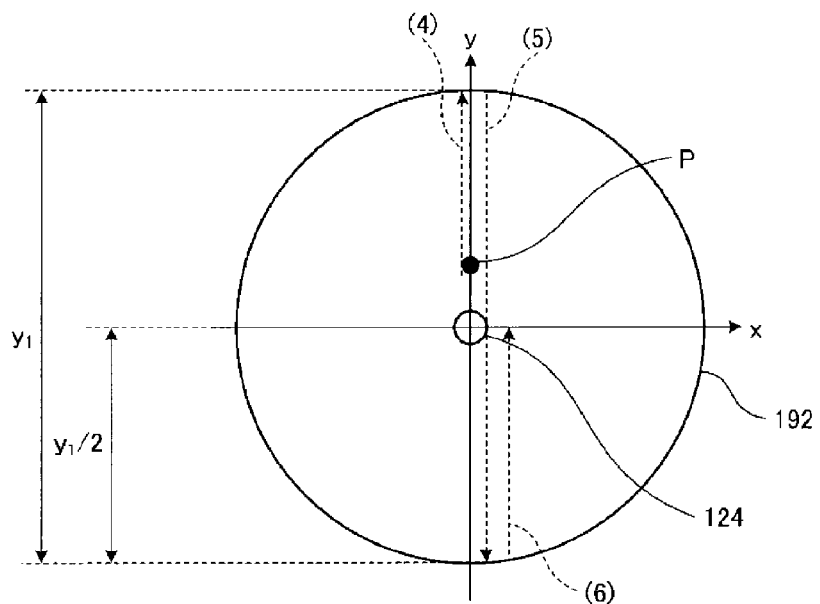
FIG. 5 is a diagram for describing an example processing for adjusting the irradiation position of the light at the rear surface of the placing table toward the position of the first window.

FIG. 4 and FIG. 5 are diagrams for describing an example processing for adjusting the irradiation position of the light at the rear surface 119 of the placing table 110 toward the position of the first window 124. FIG. 4 and FIG. 5 illustrate the first window 124 and the cylindrical first reflection member 192 which encloses the first window 124. Further, FIG. 4 and FIG. 5 illustrate the x-axis and the y-axis intersecting with each other at the position of the first window 124 on the rear surface 119 of the placing table 110 as the origin. Furthermore, FIG. 4 and FIG. 5 also illustrate the irradiation position P of the light reaching the rear surface 119 of the placing table 110 after being irradiated from the first light irradiation unit 172. The irradiation position P of the light is deviated from the position of the first window 124.

By controlling the first adjusting device 174, the controller 200 moves the first light irradiation unit 172 in a positive x-axis direction until the intensity of the reflection light detected by the first detector 176 becomes equal to or less than a threshold value ((1) of FIG. 4). Along with the movement of the first light irradiation unit 172, the irradiation position P is moved in the positive x-axis direction. If the irradiation position P which is moved in the positive x-axis direction reaches the edge of the first reflection member 192, the reflection light which is returned to the first light irradiation unit 172 from the first reflection member 192 disappears, so that the intensity of the reflection light detected by the first detector 176 becomes equal to or less than the threshold value. The controller 200 stops the first adjusting device 174 at the moment when the intensity of the reflection light detected by the first detector 176 becomes equal to or less than the threshold value, thus completing the movement of the first light irradiation unit 172 in the positive x-axis direction.

Thereafter, by controlling the first adjusting device 174, the controller 200 moves the first light irradiation unit 172 in a negative x-axis direction until the intensity of the reflection light detected by the first detector 176 becomes equal to or less than the threshold value ((2) of FIG. 4). Along with the movement of the first light irradiation unit 172, the irradiation position P is moved in the negative x-axis direction. If the irradiation position P which is moved in the negative x-axis direction reaches the edge of the first reflection member 192, the reflection light which is returned to the first light irradiation unit 172 from the first reflection member 192 disappears, so that the intensity of the reflection light detected by the first detector 176 becomes equal to or less than the threshold value. The controller 200 stops the first adjusting device 174 at the moment when the intensity of the reflection light detected by the first detector 176 becomes equal to or less than the threshold value, so that the movement of the first light irradiation unit 172 in the negative x-axis direction is completed. Then, the controller 200 measures a first maximum moving amount $x_1$, which is a moving amount of the first light irradiation unit 172 until the movement in the negative x-axis direction is completed after the completion of the movement in the positive x-axis direction.

Subsequently, by controlling the first adjusting device 174, the controller 200 moves the first light irradiation unit 172 by a half of the first maximum moving amount ($x_1/2$) in the positive x-axis direction, thus allowing, with respect to the x-axis, an x-coordinate of the irradiation position P to coincide with an x-coordinate (x=0) of the position of the first window 124 ((3) of FIG. 4).

Thereafter, by controlling the first adjusting device 174, the controller 200 moves the first light irradiation unit 172 in a positive y-axis direction until the intensity of the reflection light detected by the first detector 176 becomes equal to or less than the threshold value ((4) of FIG. 5).

Along with the movement of the first light irradiation unit 172, the irradiation position P is moved in the positive y-axis direction. If the irradiation position P which is moved in the positive y-axis direction reaches the edge of the first reflection member 192, the reflection light which is returned to the first light irradiation unit 172 from the first reflection member 192 disappears, so that the intensity of the reflection light detected by the first detector 176 falls equal to or less than the threshold value. The controller 200 stops the first adjusting device 174 at the moment when the intensity of the reflection light detected by the first detector 176 becomes equal to or less than the threshold value, thus completing the movement of the first light irradiation unit 172 in the positive y-axis direction.

Subsequently, by controlling the first adjusting device 174, the controller 200 moves the first light irradiation unit 172 in a negative y-axis direction until the intensity of the reflection light detected by the first detector 176 becomes equal to or less than the threshold value ((5) of FIG. 5). Along with the movement of the first light irradiation unit 172, the irradiation position P is moved in the negative y-axis direction. If the irradiation position P which is moved in the negative y-axis direction reaches the edge of the first reflection member 192, the reflection light which is returned to the first light irradiation unit 172 from the first reflection member 192 disappears, so that the intensity of the reflection light detected by the first detector 176 falls equal to or less than the threshold value. The controller 200 stops the first adjusting device 174 at the moment when the intensity of the reflection light detected by the first detector 176 becomes equal to or less than the threshold value, thus completing the movement of the first light irradiation unit 172 in the negative y-axis direction. Then, the controller 200 measures a second maximum moving amount $y_1$, which is a moving amount of the first light irradiation unit 172 until the movement in the negative y-axis direction is completed after the completion of the movement in the positive y-axis direction.

Subsequently, by controlling the first adjusting device 174, the controller 200 moves the first light irradiation unit 172 by a half of the second maximum moving amount (02) in the positive y-axis direction, thus allowing, with respect to the y-axis, a y-coordinate of the irradiation position P to coincide with a y-coordinate (y=0) of the position of the first window 124 ((6) of FIG. 5).

Through the above-described operations, when the irradiation position of the light irradiated from the first light irradiation unit 172 is deviated from the position of the first window 124, the plasma processing apparatus 100 is capable of moving the irradiation position to the position of the first window 124 by using the reflection light which is returned to the first light irradiation unit 172 from the first reflection member 192. That is, the plasma processing apparatus 100 is capable of adjusting the irradiation position to the position of the first window 124 by scanning the irradiation position within a range of the first reflection member 192, which is placed at the rear surface 119 of the placing table 110 facing the first light irradiation unit 172, by using the reflection light from the first reflection member 192. Therefore, in the plasma processing apparatus 100, the range in which the irradiation position of the light is scanned can be narrowed, as compared to an adjusting method in which the irradiation position of the light is scanned at the entire rear surface 119 of the placing table 110. As a result, a time required to adjust the irradiation position of the light can be shortened.

Besides, by repeating the adjustment with respect to the x-axis shown in FIG. 4 and the adjustment with respect to the y-axis shown in FIG. 5 multiple times, the irradiation position of the light can be made to be coincident with the position of the first window 124 with higher precision.

Further, assume a situation where the adjustment with respect to the x-axis shown in FIG. 4 is performed in a state that the y-coordinate of the irradiation position P is coincident with or close to the y-coordinate of the position of the first window 124, or a situation where the adjustment with respect to the y-axis shown in FIG. 5 is performed in a state that the x-coordinate of the irradiation position P is coincident with or close to the x-coordinate of the position of the first window 124. In these situations, if the irradiation position P is moved, the irradiation position P passes the first window 124. At this time, there is no reflection light which is returned to the first light irradiation unit 172 from the first reflection member 192, and the light reflected on the wafer W after being transmitted through the first window 124 is returned back to the first light irradiation unit 172. Thus, the intensity of the reflection light detected by the first detector 176 may be varied. In this case, by comparing the intensity of the reflection light from the first reflection member 192 and the intensity of the reflection light from the wafer W, the plasma processing apparatus 100 is capable of making the irradiation position of the light coincident with the position of the first window 124 with higher precision.

Figure 6:
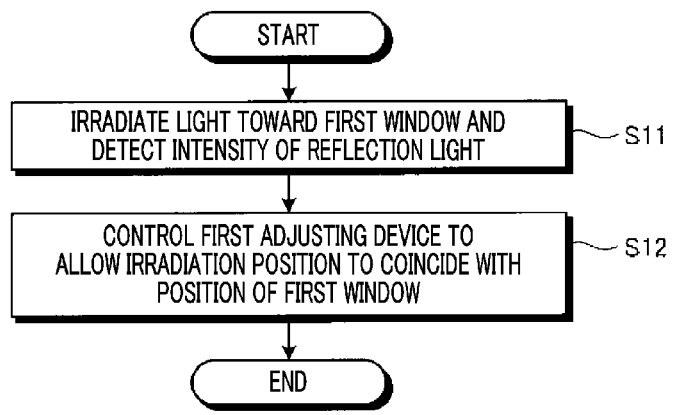
FIG. 6 is a flowchart illustrating an example flow of an irradiation position adjusting processing according to the exemplary embodiment.

Now, a flow of an irradiation position adjusting processing using the plasma processing apparatus 100 according to the exemplary embodiment will be described. FIG. 6 is a flowchart illustrating an example flow of the irradiation position adjusting processing according to the exemplary embodiment.

As depicted in FIG. 6, the first detector 176 irradiates the light toward the first window 124 from the first light irradiation unit 172 and detects the intensity of the reflection light returned to the first light irradiation unit 172 from the first reflection member 192 (process S11). The first detector 176 outputs the detection result to the controller 200.

Based on the detection result, the controller 200 controls the first adjusting device 174 so that the irradiation position of the light at the rear surface 119 of the placing table 110 coincides with the position of the first window 124 (process S12), and ends the irradiation position adjusting processing.

As stated above, a substrate processing apparatus according to the exemplary embodiment includes a placing table, a first adjusting device and a first reflection member. The placing table has a placing surface on which a substrate is placed and a rear surface opposite to the placing surface, and is provided with a first window which allows the placing surface and the rear surface to communicate with each other and is capable of transmitting light. A first adjusting device is configured to hold a first light irradiation unit which is configured to irradiate light for measurement of a state of the substrate toward the first window, and is capable of adjusting an irradiation position of the light reaching the rear surface of the placing table after being irradiated from the first light irradiation unit. The first reflection member has retroreflection property. The first reflection member is disposed at the rear surface of the placing table to enclose the first window, and reflects a part of the light irradiated from the first light irradiation unit and returns the reflection light indicating a deviation between the irradiation position of the light and a position of the first window to the first light irradiation unit. Accordingly, the substrate processing apparatus is capable of shortening a time required for the adjustment of the irradiation position of the light.

Further, the substrate processing apparatus according to the exemplary embodiment further includes a first detector and a controller. The first detector is configured to irradiate the light for the measurement of the state of the substrate toward the first window from the first light irradiation unit and detect an intensity of the reflection light returned to the first light irradiation unit from the first reflection member. Based on a detection result of the first detector, the controller controls the first adjusting device so that the irradiation position at the rear surface of the placing table coincides with the position of the first window. Accordingly, as compared to an adjusting method of scanning the irradiation position of the light at the entire rear surface of the placing table, the substrate processing apparatus is capable of narrowing a range in which the irradiation position of the light is scanned, and is thus capable of shortening the time required for the adjustment of the irradiation position of the light.

Furthermore, in the substrate processing apparatus, the first reflection member has a cylindrical shape an edge of which lies on a concentric circle centered around the position of the first window. The first adjusting device is configured to adjust the irradiation position by moving the first light irradiation unit along a first axis and a second axis which intersect with each other at the position of the first window as an origin at the rear surface of the placing table. Accordingly, the substrate processing apparatus is capable of narrowing the range in which the irradiation position of the light is scanned to a range defined along the two axes at the rear surface of the placing table. Therefore, the time required for the adjustment of the irradiation position of the light can be further shortened.

Moreover, in the substrate processing apparatus, the first reflection member has a cylindrical shape an edge of which lies on a concentric circle centered around the position of the first window. The first adjusting device is configured to adjust the irradiation position by inclining the first light irradiation unit along the first axis and the second axis which intersect with each other at the position of the first window as the origin at the rear surface of the placing table. Accordingly, the substrate processing apparatus is capable of narrowing the range in which the irradiation position of the light is scanned to the range defined along the two axes at the rear surface of the placing table. Therefore, the time required for the adjustment of the irradiation position of the light can be further shortened.

In addition, in the substrate processing apparatus according to the exemplary embodiment, the placing table has a second placing surface on which a ring member configured to surround the substrate is placed, and is provided with a second window which allows the second placing surface and the rear surface to communicate with each other and is capable of transmitting the light. Further, the substrate processing apparatus further includes a second adjusting device and a second reflection member. The second adjusting device is configured to hold a second light irradiation unit which is configured to irradiate light for measurement of a state of the ring member toward the second window, and is capable of adjusting an irradiation position of the light reaching the rear surface of the placing table after being irradiated from the second light irradiation unit. The second reflection member has retroreflection property. The second reflection member is disposed at the rear surface of the placing table to enclose the second window, and reflects a part of the light irradiated from the second light irradiation unit and returns the reflection light indicating a deviation between the irradiation position of the light and a position of the second window to the second light irradiation unit. Accordingly, the substrate processing apparatus is capable of shortening a time required for the adjustment of the irradiation position of the light for the measurement of the state of the substrate and the light for the measurement of the state of the ring member.

Moreover, the substrate processing apparatus according to the exemplary embodiment is further equipped with a second detector. The second detector is configured to irradiate the light for the measurement of the state of the ring member toward the second window from the second light irradiation unit and detect an intensity of the reflection light returned from the second reflection member to the second light irradiation unit. Based on a detection result of the second detector, the controller controls the second adjusting device so that the irradiation position at the rear surface of the placing table coincides with the position of the second window. Accordingly, as compared to the adjusting method of scanning the irradiation position of the light at the entire rear surface of the placing table, the substrate processing apparatus is capable of narrowing the range in which the irradiation position of the light is scanned, and is thus capable of shortening the time required for the adjustment of the irradiation position of the light.

Furthermore, it should be noted that the above-described exemplary embodiments are illustrative in all aspects and are not anyway limiting. The above-described exemplary embodiments may be omitted, replaced and modified in various ways without departing from the scope and the spirit of claims.

In the above-described exemplary embodiment, the first reflection member 192 and the second reflection member 194 have the cylindrical shape. However, the shape of each reflection member is not limited thereto. By way of example, the reflection member may have a rectangular barrel shape having a regular distance from each side thereof to the position of the window.

Further, an optical path adjuster may be provided between the first light irradiation unit 172 and the rear surface 119 of the placing table 110, and between the second light irradiation unit 182 and the rear surface 119 of the placing table 110.

In addition, the above exemplary embodiment has been described for the example case where the irradiation position is adjusted by moving the first light irradiation unit 172 along the x-axis and the y-axis based on the intensity of the reflection light detected by the first detector 176. However, the present disclosure is not limited thereto. By way of example, after moving the first light irradiation unit 172 along the x-axis and the y-axis, the plasma processing apparatus 100 may search for a position where the intensity of the reflection light detected by the first detector 176 is maximized and then finely adjust the irradiation position toward the found position.

According to the exemplary embodiment, it is possible to shorten the time required to adjust the irradiation position of the light.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:
a placing table, having a first placing surface on which a substrate is placed and a rear surface opposite to the first placing surface, provided with a first window which allows the first placing surface and the rear surface to communicate with each other and which is configured to transmit light;
a first adjusting device configured to hold a first light irradiation unit configured to irradiate light for state measurement of the substrate toward the first window and configured to adjust an irradiation position of the light irradiated from the first light irradiation unit on the rear surface of the placing table; and
a first reflection member, having retroreflection property, disposed at the rear surface of the placing table to enclose the first window, and configured to reflect a part of the light irradiated from the first light irradiation unit and return reflection light indicating a deviation between the irradiation position of the light and a position of the first window to the first light irradiation unit,
wherein the first reflection member has a cylindrical shape whose circle edge is concentric with a circle edge of the first window, and
a through hole, through which the first window is exposed, is formed at a central portion of the first reflection member.

2. The strate processing apparatus of claim 1, further comprising:
a first detector configured to irradiate the light for the state measurement of the substrate toward the first window from the first light irradiation unit and configured to detect an intensity of the reflection light returned to the first light irradiation unit from the first reflection member; and
a controller configured to control the first adjusting device based on a detection result of the first detector to allow the irradiation position on the rear surface of the placing table to coincide with the position of the first window.

3. The strate processing apparatus of claim 2,
wherein
the first adjusting device is configured to adjust the irradiation position by moving the first light irradiation unit along a first axis and a second axis which intersect with each other at the position of the first window as an origin on the rear surface of the placing table.

4. The substrate processing apparatus of claim 3,
wherein
the first adjusting device is configured to adjust the irradiation position by inclining an optical axis of the first light irradiation unit along a first axis and a second axis which intersect with each other at the position of the first window as an origin on the rear surface of the placing table.

5. The strate processing apparatus of claim 1,
wherein
the first adjusting device is configured to adjust the irradiation position by moving the first light irradiation unit along a first axis and a second axis which intersect with each other at the position of the first window as an origin on the rear surface of the placing table.

6. The strate processing apparatus of claim 1,
wherein
the first adjusting device is configured to adjust the irradiation position by inclining an optical axis of the first light irradiation unit along a first axis and a second axis which intersect with each other at the position of the first window as an origin on the rear surface of the placing table.

7. The strate processing apparatus of claim 1,
wherein the placing table has a second placing surface on which a ring member disposed to surround the substrate is placed, and is provided with a second window which allows the second placing surface and the rear surface to communicate with each other and which is configured to transmit the light, and
wherein the substrate processing apparatus further comprises:
a second adjusting device configured to hold a second light irradiation unit which is configured to irradiate light for state measurement of the ring member toward the second window and configured to adjust an irradiation position of the light irradiated from the second light irradiation unit on the rear surface of the placing table; and
a second reflection member, having retroreflection property, disposed at the rear surface of the placing table to enclose the second window, and configured to reflect a part of the light reflected from the second light irradiation unit and return reflection light indicating a deviation between the irradiation position of the light and a position of the second window to the second light irradiation unit.

8. The strate processing apparatus of claim 7, further comprising:
a second detector configured to irradiate the light for the state measurement of the ring member toward the second window from the second light irradiation unit and configured to detect an intensity of the reflection light returned to the second light irradiation unit from the second reflection member; and
a controller configured to control the second adjusting device based on a detection result of the second detector to allow the irradiation position on the rear surface of the placing table to coincide with the position of the second window.

* * * * *

UNITED STATES PATENT AND TRADEMARK OFFICE
CERTIFICATE OF CORRECTION

PATENT NO. : 11,621,179 B2
APPLICATION NO. : 16/874730
DATED : April 4, 2023
INVENTOR(S) : Satoshi Suzuki It is certified that error appears in the above-identified patent and that said Letters Patent is hereby corrected as shown below:

In the Specification

Column 11, Line 41, "(02)" should be -- $(y_1/2)$ --.

In the Claims

Column 15, Line 32, "strate" should be -- substrate --.

Column 15, Line 45, "strate" should be -- substrate --.

Column 16, Line 4, "strate" should be -- substrate --.

Column 16, Line 11, "strate" should be -- substrate --.

Column 16, Line 19, "strate" should be -- substrate --.

Column 16, Line 43, "strate" should be -- substrate --.

Signed and Sealed this
Second Day of January, 2024

Katherine Kelly Vidal
*Director of the United States Patent and Trademark Office*